United States Patent
Poole et al.

(10) Patent No.: US 7,858,146 B2
(45) Date of Patent: Dec. 28, 2010

(54) METHOD OF ELECTROLESSLY DEPOSITING METAL ON THE WALLS OF THROUGH-HOLES

(75) Inventors: Mark A. Poole, Shrewsbury, MA (US); Andrew J. Cobley, Coventry (GB); Amrik Singh, Coventry (GB); Kevin Bass, Loughborough (GB)

(73) Assignee: Rohm and Haas Electronic Materials LLC, Malborough, MA (US)

( * ) Notice: Subject to any disclaimer, the term of this patent is extended or adjusted under 35 U.S.C. 154(b) by 0 days.

(21) Appl. No.: 11/824,222

(22) Filed: Jun. 29, 2007

(65) Prior Publication Data

US 2009/0004382 A1 Jan. 1, 2009

(51) Int. Cl.
*B05B 7/22* (2006.01)
(52) U.S. Cl. ...................... 427/97.9; 427/230
(58) Field of Classification Search ........... 427/96.1, 427/97.2, 97.7, 97.8, 97.9, 98.1, 98.2, 98.7–99.1, 427/99.5, 230, 307, 443.1
See application file for complete search history.

(56) References Cited

U.S. PATENT DOCUMENTS

| | | | |
|---|---|---|---|
| 4,425,380 A * | 1/1984 | Nuzzi et al. ............ | 427/97.2 |
| 4,652,311 A | 3/1987 | Gulla et al. | |
| 5,017,742 A | 5/1991 | Bladon | |
| 5,143,592 A | 9/1992 | Toro | |
| 5,648,125 A * | 7/1997 | Cane ..................... | 427/534 |
| 5,767,056 A | 6/1998 | Lenoir | |
| 6,277,799 B1 * | 8/2001 | Sachdev et al. ......... | 510/176 |
| 6,652,731 B2 | 11/2003 | Cobley et al. | |
| 6,691,912 B2 | 2/2004 | Carano et al. | |
| 6,736,954 B2 | 5/2004 | Cobley et al. | |
| 6,773,573 B2 | 8/2004 | Gabe et al. | |
| 6,911,068 B2 | 6/2005 | Cobley et al. | |
| 2004/0216761 A1 * | 11/2004 | Cobley et al. .......... | 134/1 |

OTHER PUBLICATIONS

Goosey et al., "An introduction to high performance laminates and the importance of using optimized chemical processes in PCB fabrication," Circuit World 30/4, 2004, pp. 34-39.*
Goosey et al.; "An introduction to high performance laminates and the importance of using optimized chemical processes in PCB fabrication"; Circuit World 30/4; 2004; pp. 34-39.

* cited by examiner

*Primary Examiner*—William Phillip Fletcher, III
(74) *Attorney, Agent, or Firm*—John J. Piskorski

(57) ABSTRACT

Methods of electroless metallization are disclosed. The methods include treating through-holes of printed wiring boards to increase catalyst adsorption on the walls of the through-holes. The increased catalyst adsorption improves electroless metallization of the through-hole walls.

9 Claims, 1 Drawing Sheet

BACKLIGHT GRADING SCALE
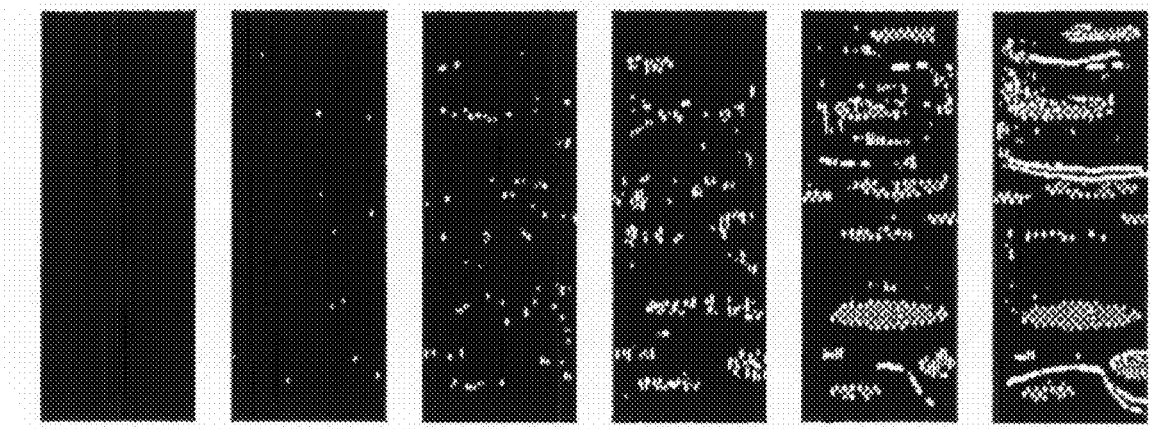
5.0    4.5    4.0    3.5    3.0    2.5
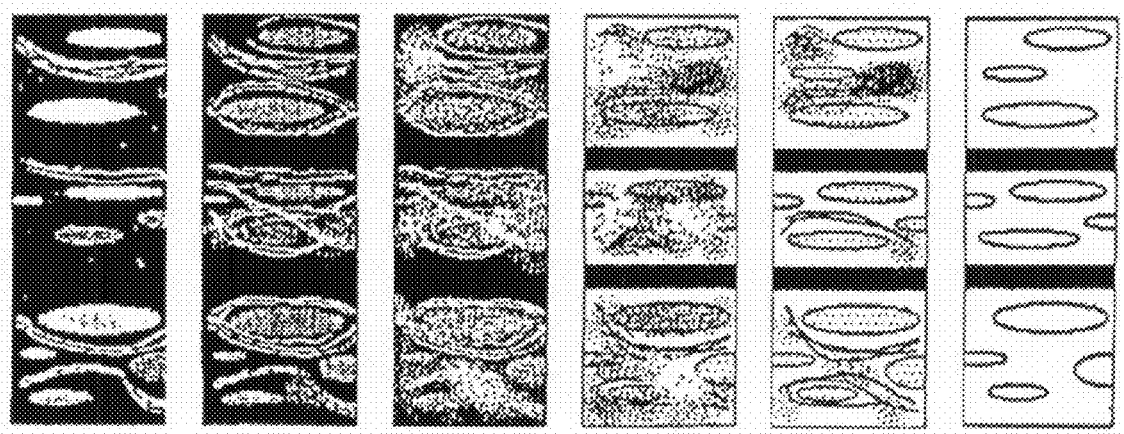
2.0    1.5    1.0    0.5    0.0    0.0
FIG.

METHOD OF ELECTROLESSLY DEPOSITING METAL ON THE WALLS OF THROUGH-HOLES

The present invention is directed to improved electroless methods of depositing metals on polymer materials. More specifically, the present invention is directed to improved electroless methods of depositing metals on polymer materials with high glass transition temperatures.

Electroless metal deposition on polymer materials has been done in a number of industries for many years. Such polymer materials are often components of composite articles composed of a polymer resin sheet with a continuous or discontinuous thin metal foil laminated to both sides of the sheet. Examples of such composite articles are printed circuit boards (PCBs).

Several printed circuit boards may be laminated together to form multilayer boards. In multilayer boards the circuit of one board is connected to the circuit of one or more of the other boards. This is achieved by forming pads or circular areas of metal at points on the conductive lines of the board. The pads also may be isolated from the conductive lines. The other boards that are to be connected are similarly provided with pads and in the laminating process the pads of the different boards are aligned over one another.

The multilayer board is then pressed and cured after which the pads of the multilayer board are drilled to form through-holes. Since the through-hole in cross-section presents a surface of alternating layers of the pads of the individual printed circuit boards separated by non-conductive polymer resin, an electrically conductive element has to be employed in the through-hole to form an electrical connection between the pads. This is done by a process known in the art as through-hole plating (PTH).

Through-hole forming operations in polymer resins result in the smearing of the polymer resin over the interior wall of the hole. This polymer resin smear is attributable to the generation of temperatures exceeding those at which polymer materials decompose during the through-hole forming process. Removal of the smear from the walls of the through-holes is imperative to achieve the optimum metallization of the through-hole walls and to achieve optimum electrical communication between the printed circuit boards in a multilayer board. Electrical and mechanical integrity required for optimum board function can only be attained by insuring complete removal of the smear from the entire inner circumference of the through-holes.

Many methods have been developed which address the problem of removing polymer resin smear from the walls of through-holes in preparation for electroless metallization. Various examples of desmearing through-holes and electrolessly plating the through-holes are disclosed in U.S. Pat. No. 5,017,742. Such methods are suitable for desmearing and electrolessly plating through-holes in printed circuit boards with low glass transition temperature ($T_g$) polymer resins. Low $T_g$ polymer resins are those resins which have a $T_g$ of less than 160° C.

In addition to the low $T_g$ polymer containing boards, there are many polymer resins which have high $T_g$ values that are highly desirable in the manufacture of multilayer printed circuit boards. Such boards have $T_g$ values of 160° C. and greater. Examples of such boards are those which include polytetrafluoroethylene (PTFE), polytetrafluoroethylene blends, multifunctional epoxies (tetrafunctional), phenolic cured epoxies, modified epoxies such as epoxies blended with cyanate esters and polyphenylene oxide (PPO), BT epoxy (bismaleimide/triazine and epoxy resins) and polyphenylene ether resins (PPE). Such printed circuit boards are desired for use in sequential build up (SBU) applications over the lower $T_g$ boards.

The electronics industry has traditionally relied upon the use of conventional FR4 epoxy based, glass reinforced laminates for the manufacture of rigid PCBs. However, as the market has increasingly demanded products that are smaller, lighter, cheaper but with improved performance and increased functionality and reliability, conventional laminates are no longer capable of meeting the required performance criteria.

Improved performance has necessitated increase in operating frequencies and signal speeds and therefore factors such as dielectric constant (Dk) and dissipation factor (Df) of the PCB and thus, the laminate, have become increasingly important. Signal propagation speed is inversely proportional to the square root of the dielectric constant and consequently a lower Dk permits faster signal speeds. Signal loss through dissipation directly relates to signal speed and thus, the lower the Df the greater the efficiency of signal propagation. The Df or loss tangent (tan δ) is a key requirement for high speed, high frequency applications and laminates with low loss tangents, i.e. a Df of less than 0.025 (measured at 1 MHz), are of particular interest (Note: typical Df values for conventional FR4 are 0.027 to 0.035). High $T_g$ laminates particularly those with $T_g$'s in excess of 200° C. tend to have more desirable low loss properties and dielectric constants than FR4.

Near the $T_g$ the resin system starts to soften and above the $T_g$ the resin properties are more consistent with those of a gel. For a given operating temperature range it may be seen that the higher the $T_g$ of the laminate, the greater the degree of dimensional stability compared to conventional FR4 type materials. Above the $T_g$, the rate of thermal expansion increase and therefore, lower $T_g$ materials exhibit a greater degree of expansion in the x-y axis and especially in the z-axis. This movement is typically measured by the coefficient of thermal expansion (CTE), which is the measure of the amount of expansion per degree increase in temperature. Controlled CTE materials aim to reduce movement in the x-y plane to 6-10 ppm/° C. from the 12-16 ppm/° C. typically associated with FR4, thereby reducing the impact of CTE mismatch between laminates and packaged devices. Movement in the z-axis can result in the loss of through-hole integrity, especially for thermal shock regimes which may exceed 288° C. The z-axis CTE for FR4 is typically 340 ppm/° C. (measured above the $T_g$) and thus, the aim of laminate manufacturers is to develop higher $T_g$ products with z-axis CTE values lower than 300 ppm/° C. (Note: x-y CTE is also influenced by the reinforcement material whereas z-axis is predominantly a function of resin properties).

One other factor driving the need for higher $T_g$ laminate relates to the removal, or replacement, of lead from the traditional tin-lead solder. The proposed alternative solders all tend to have higher melting points and thus, PCBs have to be manufactured from materials capable of withstanding increased soldering temperatures.

One problem with PCBs of high $T_g$ polymers is the difficulty in desmearing their through-holes. Such boards have through-holes with a smoother wall surface than conventional FR4 epoxy/glass boards which have a porous or honeycombed surface. Such a porous surface is desirable for obtaining complete coverage of the through-hole walls with catalysts prior to electroless metallization. Conventional desmear compositions have not been found satisfactory for desmearing through-holes of high $T_g$ boards. However, conventional desmear compositions have not been found satisfactory for desmearing through-holes of high $T_g$ boards.

Also, ring voiding is another problem with high $T_g$ boards. Ring voiding is a lack of metal coverage in a region of the board adjacent another metal layer after electroless metallization, thus a discontinuous copper layer is formed. It is also possible that when processing high $T_g$ boards with acidic conditioners contamination of subsequent process baths may occur causing, for example, catalyst baths to crash and foam generation in electroless copper baths. The latter may produce poor metal coverage on the walls of the though-holes and flaring around the holes. Flaring is stains around the through-holes after electroless metallization. Such flaring may compromise electrical performance in electrical devices containing the printed circuit boards.

Alkaline conditioners, such as aqueous alkaline surfactants, may provide greater catalyst adsorption on through-hole walls, however, there is a greater risk of over catalysation. Over catalysation results in poor adhesion and interconnect defects (ICDs) between boards.

Double conditioning with alkaline conditioners of high $T_g$ boards typically results in an increase of catalyst adsorption with good electroless metal coverage, however, there are a number of risks. Double conditioning may result in over conditioning through-holes resulting in increased stress in the metal deposit leading to defects such as transverse glass strand splitting, glass voids and resin voids. Such defects also cause poor backlight values. Electroless metal and polymer adhesion problems also may occur such as through-hole wall pull away. This is observable where the metal deposit separates from the through-hole wall. Further, if the inner layers of the multilayer board are not sufficiently cleaned by micro-etching then there is a higher risk of ICDs.

Accordingly, although the electroless metallization method disclosed in U.S. Pat. No. 5,017,742 is suitable for low $T_g$ polymer containing printed circuit boards, there is a need for a method of electroless metallization of high $T_g$ polymer containing boards.

In one aspect methods include: a) providing a substrate with through-holes; b) desmearing the through-holes; c) applying a composition including alkaline hydroxide to the through-holes; and d) electrolessly depositing a metal on walls of the through-holes.

In another aspect methods include: a) providing a substrate with through-holes; b) applying a solvent swell to the through-holes; c) applying a promoter to the through-holes; d) neutralizing the through-holes; e) applying a composition including alkaline hydroxide to the through-holes; f) conditioning the through-holes; g) micro-etching the through-holes; h) applying a pre-dip to the through-holes; i) applying a catalyst to the through-holes; and j) depositing a metal on the walls of the through-holes with an electroless metal composition.

The methods increase catalyst adsorption to through-holes walls of high $T_g$ polymer containing substrates such as printed circuit boards. This improves metal deposition and eliminates or at least reduces ICD defects, ring voiding and flaring around through-holes. Additionally, the methods eliminate double conditioning and the problems associated with it such as over conditioning of the through-holes, increased stress in metal deposits, glass voids, transverse glass strand splitting, resin voids and though-hole pull away and ICDs.

The FIGURE illustrates a European Backlight Grading Scale of 0 to 5 to show the amount of catalyst coverage on through-hole walls.

As used throughout this specification, the abbreviations given below have the following meanings, unless the context clearly indicates otherwise: g=gram; mg=milligram; ml=milliliter; L=liter; cm=centimeter; m=meter; mm=millimeter; μm=micron; min.=minute; ppm=parts per million; ° C.=degrees Centigrade; M=molar; g/L=grams per liter; s=seconds; wt %=percent by weight; $T_g$=glass transition temperature; and dyne=1 g-cm/s$^2$=(10$^{-3}$ Kg) (10$^{-2}$ m)/s$^2$=10$^{-5}$ Newtons.

The terms "printed circuit board" and "printed wiring board" are used interchangeably throughout this specification. The terms "plating" and "deposition" are used interchangeably throughout this specification. A dyne is a unit of force. All amounts are percent by weight, unless otherwise noted. All numerical ranges are inclusive and combinable in any order except where it is logical that such numerical ranges are constrained to add up to 100%.

Methods include applying compositions of alkaline hydroxides to substrates containing high $T_g$ polymer materials after desmearing and before depositing metals on the substrates by electroless metal deposition. The alkaline hydroxide compositions include sodium hydroxide, potassium hydroxide or mixtures thereof. Typically a composition of aqueous sodium hydroxide is used. The hydroxides are included in the compositions in amounts of 0.1 gm/L to 100 gm/L or such as from 5 gm/L to 25 gm/L. More typically the hydroxides are included in the compositions in amounts of 15 gm/L to 20 gm/L.

The alkaline hydroxide compositions may be used with any desmear and through-hole plating method for electroless deposition of metals including vertical and horizontal processes. Typically the methods are used to electrolessly deposit metals on the walls of through-holes in printed circuit boards and multilayer printed circuit boards containing high $T_g$ polymer resins.

Through-holes are formed in the board by drilling or punching or any other method known in the art. After the formation of the through-holes, the boards are rinsed with water and a conventional organic solution to clean and degrease the board followed by desmearing the through-hole walls. Typically desmearing of the through-holes begins with application of a solvent swell.

Any conventional solvent swell may be used to desmear the through-holes. Examples of solvent swells include glycol ethers and their associated ether acetates. Conventional amounts of glycol ethers and their associated ether acetates may be used. Such solvent swells are well known in the art. Commercially available solvent swells include, but are not limited to, CIRCUPOSIT CONDITIONER™ 3302, CIRCUPOSIT HOLE PREP™ 3303 and CIRCUPOSIT HOLE PREP™ 4120 (obtainable from Rohm and Haas Electronic Materials, Marlborough, Mass.).

Optionally, the through-holes are rinsed with water. A promoter is then applied to the through-holes. Conventional promoters may be used. Such promoters include sulfuric acid, chromic acid, alkaline permanganate or plasma etching. Typically alkaline permanganate is used as the promoter. An example of a commercially available promoter is CIRCUPOSIT PROMOTER™ 4130 available from Rohm and Haas Electronic Materials, Marlborough, Mass.

Optionally, the through-holes are rinsed again with water. A neutralizer is then applied to the through-holes to neutralize any acid residues or basic residues left by the promoter. Conventional neutralizers may be used. Typically the neutralizer is an aqueous alkaline solution containing one or more amines or a solution of 3 wt % peroxide and 3 wt % sulfuric acid. Optionally, the through-holes are rinsed with water and the printed circuit boards are dried.

After desmearing the through-holes are then treated with the alkaline hydroxide solution to prepare the through-holes for electroless metallization. The composition contacts the through-holes for 30 seconds to 120 seconds or such as 60 seconds to 90 seconds. Application of the alkaline hydroxide composition between the desmear and plating the through-holes provides for good coverage of the through-hole walls with the catalyst such that the metal covers the walls. Typically the alkaline hydroxide solution is an aqueous solution of sodium hydroxide, potassium hydroxide or mixtures thereof. More typically it is sodium hydroxide. If the alkaline hydroxide solution is a mixture of sodium hydroxide and potassium hydroxide, the sodium hydroxide and potassium hydroxide are in a weight ration of 4:1 to 1:1, or such as from 3:1 to 2:1.

Optionally, a surfactant may be added to the alkaline hydroxide solution. Typically the surfactants are non-ionic surfactants. The surfactants reduce surface tension to enable proper wetting of the through-holes. Surface tension after application of the surfactant in the through-holes ranges from 25 dynes/cm to 50 dynes/cm, or such as from 30 dynes/cm to 40 dynes/cm. Typically the surfactants are included in the formulation when the alkaline hydroxide solution is used to treat small through-holes to prevent flaring. Small through-holes typically range in diameter of 0.2 mm to 0.5 mm. In contrast, large through-holes typically range in diameter of 0.5 mm to 1 mm. Aspect ratios of through-holes may range from 1:1 to 20:1.

In addition to through-holes, the method also may be used with microvias. Typically microvias have diameters of 50 μm to 300 μm.

Surfactants are included in the alkaline hydroxide composition in amounts of 0.05 wt % to 5 wt %, or such as from 0.25 wt % to 1 wt %. Suitable non-ionic surfactants include, for example, aliphatic alcohols such as alcohol alkoxylates. Such aliphatic alcohols have ethylene oxide, propylene oxide, or combinations thereof, to produce a compound having a polyoxyethylene or polyoxypropylene chain within the molecule, i.e., a chain composed of recurring (—O—CH$_2$—CH$_2$—) groups, or a chain composed of recurring (—O—CH$_2$—CH—CH$_3$) groups, or combinations thereof. Typically such alcohol alkoxylates are alcohol ethoxylates having carbon chains of 7 to 15 carbons, linear or branched, and 4 to 20 moles of ethoxylate, typically 5 to 40 moles of ethoxylate and more typically 5 to 15 moles of ethoxylate.

Many of such alcohol alkoxylates are commercially available. Examples of commercially available alcohol alkoxylates include, for example, linear primary alcohol ethoxylates such as NEODOL 91-6, NEODOL 91-8 and NEODOL 91-9 ($C_9$-$C_{11}$ alcohols having an average of 6 to 9 moles of ethylene oxide per mole of linear alcohol ethoxylate) and NEODOL 1-73B ($C_{11}$ alcohol with an average blend of 7 moles of ethylene oxide per mole of linear primary alcohol ethoxylate). Both are available from Shell Oil Company, Houston, Tex.

After the alkaline hydroxide treatment, optionally, an acid or alkaline conditioner may be applied to the through-holes. Conventional conditioners may be used. Such conditioners may include one or more cationic surfactants, non-ionic surfactants, complexing agents and pH adjusters or buffers. Commercially available acid conditioners include, but are not limited to, CIRCUPOSIT CONDITIONER™ 3320 and CIRCUPOSIT CONDITIONER™ 3327 available from Rohm and Haas Electronic Materials, Marlborough, Mass. Suitable alkaline conditioners include, but are not limited to, aqueous alkaline surfactant solutions containing one or more quaternary amines and polyamines. Commercially available alkaline surfactants include, but are not limited to, CIRCUPOSIT CONDITIONER™ 231, 3325, 813 and 860 available from Rohm and Haas Electronic Materials. Optionally, the through-holes are rinsed with water after conditioning.

Conditioning is followed by microetching the through-holes. Conventional microeteching compositions may be used. Microetching is designed to provide a micro-roughened copper surface on exposed copper (e.g. inner layers and surface etch) to enhance subsequent adhesion of deposited electroless and electroplate. Microetches include, but are not limited to, 60 g/L to 120 g/L sodium persulfate or sodium or potassium oxymonopersulfate and sulfuric acid (2%) mixture, or generic sulfuric acid/hydrogen peroxide. An example of a commercially available microetching composition includes CIRCUPOSIT MICROETCH™ 3330 available from Rohm and Haas Electronic Materials. Optionally, the through-holes are rinsed with water.

A pre-dip is then applied to the microeteched through-holes. Examples of pre-dips include 2% to 5% hydrochloric acid or an acidic solution of 25 g/L to 75 g/L sodium chloride. Optionally, the through-holes are rinsed with cold water.

A catalyst is then applied to the through-holes. Any conventional catalyst may be used. The choice of catalyst depends on the type of metal to be deposited on the walls of the through-holes. Typically the catalysts are colloids of noble and non-noble metals. Such catalysts are well known in the art and many are commercially available or may be prepared from the literature. Examples of non-noble metal catalysts include copper, aluminum, cobalt, nickel, tin and iron. Typically noble metal catalysts are used. Suitable noble metal colloid catalysts include, for example, gold, silver, platinum, palladium, iridium, rhodium, ruthenium and osmium. More typically, noble metal catalysts of silver, platinum, gold and palladium are used. Most typically silver and palladium are used. Suitable commercially available catalysts include, for example, CIRCUPOSIT CATALYST™ 334 and CATAPOSIT™ 44 available from Rohm and Haas Electronic Materials. The through-holes optionally may be rinsed with water after application of the catalysts.

The walls of the through-holes are then plated with a metal by any suitable electroless bath. Conventional electroless baths including immersion baths and conventional plating parameters may be used. Typically the printed wiring board is placed in an electroless or immersion bath containing the metal ions of the desired metal to be deposited on the walls of the through-holes. Metals which may be deposited on the walls of the through-holes include, but are not limited to, copper, nickel, gold, silver and copper/nickel alloys. A layer of gold or silver finish using immersion gold or silver may also be deposited over a copper, copper/nickel or nickel deposit on the walls of the through-holes. Typically copper, gold and silver are deposited on the walls of the through-holes, more typically copper is deposited on the walls of the through-holes.

After the metal is deposited on the walls of the through-holes, the through-holes are optionally rinsed with water. Optionally, anti-tarnish compositions may be applied to the metal deposited on the walls of the through-holes. Conventional anti-tarnish compositions may be used. Examples of anti-tarnish compositions include ANTI TARNISH™ 7130 and CUPRATEC™ 3 (obtainable from Rohm and Haas Electronic Materials). The through-holes may optionally be rinsed by a hot water rinse at temperatures exceeding 30° C. and then the boards may be dried.

Application of the alkaline hydroxide compositions after desmear and before electroless metallization provides coverage of the through-hole walls of high $T_g$ polymer resin containing substrates by catalysts such that metal may be electrolessly deposited over the surface of the walls. The quality of metal deposition on the walls of through-holes is observable using conventional backlight measuring procedures. Additionally, the alkaline treatment reduces resin and glass voids, reduces ICDs and flaring around through-holes. Also double conditioning is eliminated thus preventing undesired over conditioning which causes increased stress in the metal deposit leading to defects such as transverse glass strand splitting, glass and resin voids. Further, the alkaline hydroxide compositions may reduce hole wall pull away between the electrolessly deposited metal and the high $T_g$ polymer resin. The methods may be used in both horizontal and vertical processes.

High $T_g$ polymer resins are resin which have a $T_g$ of 160° C. and higher. Typically such polymer resins have a $T_g$ ranging from 160° C. to 280° C. or such as from 170° C. to 240° C. Examples of polymer resins include high $T_g$ resins of polytetrafluoroethylene (PTFE) and polytetrafluoroethylene blends. Such blends include, for example, PTFE with polyphenylene oxides and cyanate esters. Other classes of polymer resins which include resins with a high $T_g$ include, but not limited to, epoxy resins, such as difunctional and multifunctional epoxy resins, bimaleimide/triazine and epoxy resins (BT epoxy), epoxy/polyphenylene oxide resins, acrylonitrilebutadienestyrene, polycarbonates (PC), polyphenylene oxides (PPO), polyphenylene ethers (PPE), polyphenylene sulfides (PPS), polysulfones (PS), polyamides, polyesters such as polyethyleneterephthalate (PET) and polybutyleneterephthalate (PBT), polyetheretherketones (PEEK), liquid crystal polymers, polyurethanes, polyetherimides, epoxies and composites thereof.

After the through-holes are metal plated, the substrates may undergo further processing. Further processing may include conventional processing by photoimaging and further metal deposition on the substrates such as electrolytic metal deposition of, for example, copper, copper alloys, tin and tin alloys.

The following examples are not intended to limit the scope of the invention but are intended to further illustrate it.

EXAMPLE 1

Comparative

Four low $T_g$ FR4 epoxy/glass boards (150° C.) and four high $T_g$ FR4 epoxy/glass boards (170° C.) were obtained from Isola Laminate Systems Corp., LaCrosse Wis. Multiple through-holes were drilled in each of the boards. The through-holes in each board were then desmeared in a horizontal desmear line process as follows:

1. Each board was treated with 240 liters of solvent swell for 100 seconds at 80° C. The solvent swell was a conventional aqueous solution of 10% diethylene glycol mono butyl ether, a surfactant and 35 g/L of sodium hydroxide.
2. The boards were then rinsed with cold water.
3. The through-holes in each board were then treated with 550 liters of an alkaline promoter of aqueous alkaline permanganate at a pH of 12 for 150 seconds at 80° C.
4. The boards were rinsed with cold water.
5. The though-holes in the boards were then treated with 180 liters of an aqueous neutralizer composed of 3 wt % hydrogen peroxide and 3 wt % sulfuric acid at room temperature for 75 seconds.
6. The boards were then rinsed with cold water.
7. Two of the low $T_g$ boards and two of the high $T_g$ boards were treated with 150 liters of an aqueous alkaline hydroxide solution containing 18 g/L of sodium hydroxide and 1 g/L of NEODOL 91-8 for 60 seconds at 50° C.
8. The four remaining boards were not treated with the alkaline hydroxide composition. However, one low $T_g$ board and one high $T_g$ board were treated with 190 liters of the aqueous acid conditioner CIRCUPOSIT CONDITIONER™ 3320 for 60 seconds at 50° C.
9. Each of the boards was then rinsed with cold water.
10. The through-holes of each of the boards were then microetched with 100 liters of an aqueous alkaline solution of 20 wt % sodium permanganate and 10 wt % sodium hydroxide for 60 minutes at 50° C. Etch rate was 0.5 μm/min. to 1 μm/min.
11. The boards are then rinsed with cold water.
12. A pre-dip was then applied to the through-holes for 40 seconds at room temperature. The pre-dip included 5% concentrated hydrochloric acid.
13. The through-holes of each board were then primed for 215 seconds at 40° C. with 125 liters of a catalyst for electroless copper metallization of the walls of the through-holes. The catalyst had the following formulation:

TABLE 1

| COMPONENT | AMOUNT |
|---|---|
| Palladium Chloride (PdCl$_2$) | 1 g |
| Concentrated Hydrochloric Acid (HCl) | 300 ml |
| Sodium Stannate (Na$_2$SnO$_3$3H$_2$O) | 1.5 g |
| Tin chloride (SnCl$_2$) | 40 g |
| Water | To one liter |

14. The boards were then rinsed with cold water.
15. The walls of the through-holes of the boards were then plated with electroless copper with 1000 liters of an electroless copper bath for 330 seconds at 50° C. The electroless copper bath had the following formulation:

TABLE 2

| COMPONENT | AMOUNT |
|---|---|
| Copper sulfate Pentahydrate | 2 g |
| Formaldehyde | 2.5 g |
| Sodium hydroxide | 5 g |
| Ethylene diamine tetraacetate (EDTA) | 25 g |
| Chloride ions | 5 g |
| 2,2-Dipyridyl | 2 ppm |
| Water | To one liter |

16. After electroless copper deposition the boards were rinsed with cold water.
17. Each board was sectioned laterally to expose the copper plated walls of the through-holes. Multiple lateral sections 1 mm thick were taken from the walls of the sectioned through-holes of each board to determine the through-hole wall coverage for the boards using the European Backlight Grading Scale.

The FIGURE is the standard European backlight grading scale used to measure the electroless copper coverage on the walls of the through-holes. 1 mm sections from each board were placed under a conventional optical microscope of 50× magnification. The quality of the copper deposit was determined by the amount of light that was observed under the microscope. If no light was observed the section was completely black and was rated a 5 on the backlight scale. If light passed through the entire section without any dark areas, this indicated by very little to no copper metal deposition on the wall and the section was rated 0. If sections had some dark regions as wells as light regions, they were rated between 0 and 5.

The holes and gaps were manually counted for each section, tallied and averaged for each board. The table below shows the results of the sections taken from each of the boards. An "X" in the box indicates that the treatment was done and a "0" indicates that the treatment was not done.

TABLE 3

| Printed Circuit Board Laminate | Alkaline Hydroxide Treatment | Acidic Conditioner Treatment | Average Backlight Scale Value |
|---|---|---|---|
| Low $T_g$ | 0 | 0 | 1.5 |
| High $T_g$ | 0 | 0 | 1 |
| Low $T_g$ | 0 | X | 4.8 |
| High $T_g$ | 0 | X | 1.5 |
| Low $T_g$ | X | 0 | 3.5 |
| High $T_g$ | X | 0 | 3.75 |
| Low $T_g$ | X | X | 4.9 |
| High $T_g$ | X | X | 4.95 |

The results showed that both the low and high $T_g$ boards which were not treated with either the alkaline hydroxide composition and the acid conditioner had numerous holes and gaps as observed under the microscope such that both types of boards were low on the backlight scale. Electroless copper deposition on the through-hole walls on these boards was poor.

The low $T_g$ boards treated with the acidic conditioner alone had an average backlight value of 4.8 which was a marked improvement over the boards which were not treated with the acidic conditioner. However, the high $T_g$ boards treated only with the acidic conditioner had an average backlight value of 1.5 which indicated poor copper metal deposition on the through-hole walls.

All of the boards treated with the alkaline hydroxide composition showed improved copper metal deposition over those boards which were not treated with the alkaline hydroxide composition or the acidic conditioner. All of the boards treated with both the alkaline hydroxide and the acidic conditioner had the best copper metal deposition with values of 4.9 for the low $T_g$ boards and 4.95 for the high $T_g$ boards. The test results showed that application of the alkaline hydroxide composition prior to electroless metallization improved copper metal deposition on through-hole walls of both high and low $T_g$ boards.

EXAMPLE 2

Comparative

Two low $T_g$ (150° C.) FR4 epoxy/glass boards and two high $T_g$ (170° C.) FR4 epoxy/glass boards and eight high $T_g$ (180° C.) NELCO 4000-6 boards were provided. Multiple through-holes were drilled into the boards and the holes were desmeared by the same procedure as disclosed in Example 1.

One of the low $T_g$ FR4 boards was treated with an alkaline hydroxide composition containing 7 g/L of sodium hydroxide for 60 seconds at 50° C. One of the high $T_g$ FR4 boards was also treated with an aqueous alkaline hydroxide solution for 60 seconds at 50° C., however, the alkaline hydroxide composition included 18 g/L of sodium hydroxide and 1 g/L of NEODOL 91-8 surfactants.

Through-holes of one NELCO 4000-6 board were treated with an aqueous alkaline composition containing 7 g/L of sodium hydroxide and through-holes of another NELCO 4000-6 board were treated with an aqueous alkaline composition containing 18 g/L of sodium hydroxide. Each board was treated for 60 seconds at 50° C. Through-holes of three of the NELCO boards were treated at 50° C. for 60 seconds with an aqueous alkaline hydroxide composition containing 18 g/L of sodium hydroxide and 1 g/L of NEODOL 91-8.

The through-holes of all of the boards were then treated with an acidic conditioner as in Example 1 followed by microetching the through-holes, applying a pre-dip and applying a tin/palladium catalyst as in Example 1. The boards were then immersed into 1000 liters of an electroless copper bath for 300 seconds at 50° C. The electroless copper bath had the following formula:

TABLE 4

| COMPONENT | AMOUNT |
|---|---|
| Copper sulfate Pentahydrate | 2.5 g |
| Formaldehyde | 5 g |
| Sodium Hydroxide | 8 g |
| EDTA | 35 g |
| Chloride | 15 g |
| 2,2-Dipyridyl | 20 ppm |
| Water | To one liter |

After metallization of the through-holes was completed, the boards were baked for six hours at 125° C. in accordance with standard procedure IPC-TM 650 2.4.8 rev.D then subjected to thermal cycling prior to laterally sectioning the boards to expose the walls of the through-holes. The thermal cycling involved floating the boards in solder composed of 60% tin and 40% lead (obtainable from Alpha Metals) at 288° C. for 10 seconds followed by air cooling the boards for 110 seconds. This cycle was repeated five times.

1 mm lateral sections were taken from multiple through-holes of each board. The sections were first analyzed under an optical microscope for the amount of light passing through the copper deposit along the through-hole walls and compared to the backlight scale to give each section a value. The backlight values were averaged for each board. The results are in the table below.

In addition to determining the backlight values, the through-hole wall pull away and ICDs of the copper deposit also were determined for multiple though-holes in each board. The hole wall pull away (HWPA) measured the degree of copper deposit peeling from the through-hole walls caused by the baking and thermal cycling as observed under the optical microscope using the standard procedure. The scale ranged from 0 to 3. The lower the number the less metal peeling observed. The HWPA scale used was from the table below:

| GRADE | HWPA (%) |
|---|---|
| 0 | 0 |
| 1.0 | 1 to 33 |
| 2.0 | 34 to 66 |
| 3.0 | 67 to 100 |

Each through-hole sidewall was graded using the above scale and the total number of each grade was determined for the number of through-holes assessed. This was then used to calculate the mean through-hole pull away (HWPA) from the equation below.

Mean HWPA=((ΣGrade 1's)+(2ΣGrade 2's)+ (3ΣGrade 3's))/number of holes×2

The results are in Table 5 below.

TABLE 5

| Printed Circuit Board Laminate | Alkaline Hydroxide Composition | Average Backlight Value | Mean HWPA Grade |
|---|---|---|---|
| Low $T_g$ FR4 | 0 | 4.55 | 1.83 |
| Low $T_g$ FR4 | 7 g/L Sodium Hydroxide | 4.7 | 2.02 |
| High $T_g$ FR4 | 0 | 3.25 | 2.18 |
| High $T_g$ FR4 | 18 g/L Sodium Hydroxide and 1 g/L NEODOL 91-8 | 4.75 | 1.07 |
| High $T_g$ NELCO | 0 | 2.25 | 0.82 |
| High $T_g$ NELCO | 7 g/L Sodium Hydroxide | 3 | 0.71 |
| High $T_g$ NELCO | 18 g/L Sodium Hydroxide | 4.75 | 0.63 |
| High $T_g$ NELCO | 18 g/L Sodium Hydroxide and 1 g/L NEODOL 91-18 | 5 | 0.82 |
| High $T_g$ NELCO | 0 | 3.75 | 0.93 |
| High $T_g$ NELCO | 0 | 3.95 | 0.99 |
| High $T_g$ NELCO | 18 g/L Sodium Hydroxide and 1 g/L NEODOL 91-8 | 4.65 | 1.19 |
| High $T_g$ NELCO | 18 g/L Sodium Hydroxide and 1 g/L NEODOL 91-8 | 4.70 | 1.06 |

Both low $T_g$ FR4 boards showed good backlight values with and without the alkaline treatment, however, the board treated with the alkaline composition (7 g/L sodium hydroxide) showed better backlight results, as expected. The HWPA grade for both low $T_g$ FR4 boards was substantially the same (i.e. 1.83 and 2.02).

The NELCO boards treated with the 18 g/L alkaline hydroxide composition and the alkaline composition containing 18 g/L sodium hydroxide and the alcohol ethoxylate NEODOL had better backlight values than the NELCO boards which were not treated with those alkaline hydroxide compositions. NELCO boards treated with the aqueous mixture of 18 g/L of sodium hydroxide and 1 g/L of the alcohol ethoxylate had backlight values from 4.65 to as high as 5 where no light was observed under the optical microscope. In contrast, the NELCO boards which were not treated with any aqueous alkaline hydroxide composition had backlight values as low as 2.25 to only as high as 3.95. Accordingly, the aqueous alkaline hydroxide treatment provided improved electroless copper metal deposition on the through-hole walls of the high $T_g$ polymer resin boards.

The high $T_g$ FR4 board that was treated with the alkaline composition containing 18 g/L sodium hydroxide and 1 g/L NEODOL had the lowest HWPA=1.07 of all of the FR4 boards, thus showing reduced copper layer peeling, and an improvement over the other FR4 boards which were not treated as such.

The overall best results were achieved with the high $T_g$ NELCO boards treated with 18 g/L of sodium hydroxide and 18 g/L sodium hydroxide and 1 g/L NEODOL 91-8 which had average backlight values of 4.75 and 5, and HWPA values of 0.63 and 0.82, respectively. HWPA values below 1 were indicative of very good copper metal adhesion. Accordingly, treatment of through-holes of high $T_g$ polymer boards with the alkaline compositions improved both catalyst coverage of through-holes and copper layer adhesion to the though-holes.

The through-holes of each of the boards also were examined for interconnect defects. Examination was done after the sections were prepared and polished to 0.2 μm silica finish but before etching with a mild ammonia/peroxide etch. This was done using optical microscopy at 100× to 150× magnification. None of the boards showed any interconnect defects (i.e. dark lines at the interface between deposited copper inner layers).

EXAMPLE 3

Comparative

Two low $T_g$ FR4 boards (150° C.), two high $T_g$ FR4 boards (170° C.) and two high $T_g$ NELCO boards (180° C.) were drilled with multiple through-holes and the holes were desmeared as in Example 1. One of each type of board was treated with an alkaline hydroxide composition containing 18 g/L of sodium hydroxide and 1 g/L of NEODOL 91-8 surfactant as described in Example 1. All of the boards were treated with the acidic conditioner of Example 1. The boards were then plated with electroless copper for 300 seconds at 50° C. using the formulation shown in the table below.

TABLE 6

| COMPONENT | AMOUNT |
|---|---|
| Copper sulfate pentahydrate | 2 g |
| Formaldehyde | 3 g |
| Sodium Hydroxide | 6 g |
| EDTA | 30 g |
| Chloride | 10 g |
| 2,2-Dipyridyl | 10 ppm |
| Water | To one liter |

Each board was sectioned laterally to expose the walls of the through-holes. Multiple 1 mm lateral sections of the walls were taken from each board and were observed for any holes or gaps in the copper deposit. Hole wall pull away also was analyzed. The table below shows the results of each analysis.

TABLE 7

| Printed Circuit Board Laminate | Alkaline Hydroxide Composition | Average Backlight Value | Mean HWPA Grade |
|---|---|---|---|
| Low $T_g$ FR4 | 0 | 4.75 | 1.16 |
| Low $T_g$ FR4 | X | 4.75 | 0.58 |
| High $T_g$ FR4 | 0 | 2.25 | 0.85 |
| High $T_g$ FR4 | X | 4.40 | 0.9 |
| High $T_g$ NELCO | 0 | 3.25 | 1.08 |
| High $T_g$ NELCO | X | 4.60 | 0.73 |

Both of the FR4 boards, high and low $T_g$ boards, showed improved backlight results when the through-holes were treated with the alkaline hydroxide composition in contrast to the boards which were not treated with the composition. The NELCO boards treated with the 18 g/L alkaline hydroxide composition and the alkaline composition containing 18 g/L of sodium hydroxide and the alcohol ethoxylate NEODOL had better backlight values than the NELCO boards which were not treated with those alkaline hydroxide compositions. NELCO boards treated with the aqueous mixture of 18 g/L of sodium hydroxide and 1 g/L of the alcohol ethoxylate had backlight values from 4.65 to as high as 5 where no light was observed under the optical microscope. In contrast, the NELCO boards which were not treated with any of the aqueous alkaline hydroxide compositions had values as low as 2.25 to only as high as 3.95. Accordingly, the aqueous alkaline hydroxide treatment provided improved electroless copper metal deposition on the through-hole walls of both low and high $T_g$ polymer resins.

The results of the hole wall pull away test showed that one of the high $T_g$ FR4 boards (HWPA=0.9) and one of the high $T_g$ NELCO boards (HWPA=0.73), which were treated with the alkaline composition, had HWPA values such that the hole wall pull away of the deposited copper was less than 30% (see Table in Example 2 above). Accordingly, application of the alkaline composition did improve electroless copper deposition on through-hole walls.

EXAMPLE 4

The same process as described in Example 1 above is repeated except that an aqueous copper/nickel alloy electroless bath is used to deposit a copper/nickel alloy on the wall of the through-holes. The copper/nickel electroless bath included: 0.02 moles/L of copper sulfate pentahydrate, 0.02 moles/L of nickel sulfate hexahydrate, 0.15 moles/L of citric acid, 0.3 mole/L of sodium hypophosphite, 0.003 moles/L of sodium tetraborate and sufficient sodium hydroxide to maintain a pH of 10. The backlight values are expected to be from 3 to 5 on at least the high $T_g$ boards.

EXAMPLE 5

The same process as described in Example 1 above is repeated except that an aqueous electroless nickel bath is used to deposit nickel on the walls of the through-holes. The electroless nickel bath includes: 25 g/L of nickel sulfate heptahydrate, 2 g/L of acetic acid, 30 g/L of lactic acid, 20 g/L of malic acid, 3 g/L of itaconic acid, 0.3 g/L of potassium iodate and 40 g/L of sodium hypophosphite. The pH of the bath is 5 and the temperature of the bath is 90° C. The backlight values are expected to be from 3 to 5 on at least the high $T_g$ boards.

EXAMPLE 6

The same process as described in Example 1 above is repeated except that an aqueous immersion gold bath is used to deposit gold on the walls of the through-holes. The immersion gold bath includes: 2 g/L of potassium gold cyanide, 150 g/L of organic phosphonic acid, 0.5 g/L of hydrazine hydrate and 1 g/L of a reaction product between epichlorohydrin and dimethylaminopropylamine. The pH of the bath is 7 and the temperature is 90° C. The backlight values are expected to be from 3 to 5 on at least the high $T_g$ boards.

EXAMPLE 7

The same process as described in Example 1 is repeated except that an aqueous immersion silver bath is used to deposit silver on the walls of the through-holes. The immersion silver bath includes: 1 g/L of substrate, 100 g/L of nitriloacetic acid (NTA), 6 g/L of picolinic acid and 0.005 g/L of DL-lysine. The pH of the bath is 9 and the temperature of the bath is 50° C. The backlight values are expected to be from 3 to 5 at least on the high $T_g$ boards.

What is claimed is:

1. A method comprising:
   a) providing a substrate with through-holes or microvias, wherein the substrate comprises one or more high $T_g$ polymer resins chosen from epoxy resins and epoxy composites;
   b) desmearing the through-holes or microvias;
   c) applying a composition comprising alkaline hydroxide and one or more aliphatic alcohol alkoxylates to the through-holes or microvias, the aliphatic alcohol alkoxylates are $C_9$-$C_{11}$ alcohols having an average of 6 to 9 moles of ethylene oxide per mole of linear alcohol ethoxylate; and
   d) electrolessly depositing a metal on walls of the through-holes or microvias.

2. The method of claim 1, wherein the alkaline hydroxide is sodium hydroxide, potassium hydroxide, or mixtures thereof.

3. The method of claim 1, wherein the alkaline hydroxide ranges from 0.1 g/L to 100 g/L of the composition.

4. The method of claim 3, wherein the alkaline hydroxide ranges from 5 g/L to 25 g/L of the composition.

5. The method of claim 1, wherein the $T_g$ is 160° C. and higher.

6. The method of claim 5, wherein the $T_g$ is from 160° C. to 280° C.

7. A method comprising:
   a) providing a substrate with through-holes or microvias, wherein the substrate comprises one or more high $T_g$ polymer resins chosen from epoxy resins and epoxy composites;
   b) applying a solvent swell to the through-holes or microvias;
   c) applying a promoter to the through-holes or microvias;
   d) neutralizing the through-holes or microvias;
   e) applying a composition comprising one or more alkaline hydroxides and one or more aliphatic alcohol alkoxylates to the through-holes or microvias, the aliphatic alcohol alkoxylates are $C_9$-$C_{11}$ alcohols having an average of 6 to 9 moles of ethylene oxide per mole of linear alcohol ethoxylate;
   f) conditioning the through-holes or microvias with an acid conditioner;
   g) microetching the through-holes or microvias;
   h) applying a pre-dip to the through-holes or microvias;
   i) applying a catalyst to the through-holes or microvias; and
   j) depositing a metal on walls of the through-holes or microvias with an electroless metal composition.

8. The method of claim 7, wherein the through-holes have diameters of 0.2 mm to 0.5 mm.

9. The method of claim 7, wherein the microvias have diameters of 50 μm to 300 μm.

* * * * *